(12) United States Patent
Hashemi et al.

(10) Patent No.: US 9,525,027 B2
(45) Date of Patent: Dec. 20, 2016

(54) LATERAL BIPOLAR JUNCTION TRANSISTOR HAVING GRADED SIGE BASE

(71) Applicant: GLOBALFOUNDRIES INC., Grand Cayman (KY)

(72) Inventors: Pouya Hashemi, White Plains, NY (US); Ali Khakifirooz, Los Altos, CA (US); Darsen D. Lu, Mount Kisco, NY (US); Alexander Reznicek, New York, NY (US); Dominic J. Schepis, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 74 days.

(21) Appl. No.: 14/208,518

(22) Filed: Mar. 13, 2014

(65) Prior Publication Data

US 2015/0263091 A1  Sep. 17, 2015

(51) Int. Cl.

| | |
|---|---|
| H01L 21/84 | (2006.01) |
| H01L 29/10 | (2006.01) |
| H01L 29/66 | (2006.01) |
| H01L 29/735 | (2006.01) |
| H01L 21/225 | (2006.01) |
| H01L 29/417 | (2006.01) |
| H01L 29/08 | (2006.01) |
| H01L 21/8249 | (2006.01) |
| H01L 27/06 | (2006.01) |

(Continued)

(52) U.S. Cl.
CPC ....... *H01L 29/1008* (2013.01); *H01L 21/2254* (2013.01); *H01L 21/8249* (2013.01); *H01L 27/0623* (2013.01); *H01L 29/0808* (2013.01); *H01L 29/0821* (2013.01); *H01L 29/41708* (2013.01); *H01L 29/6625* (2013.01); *H01L 29/66795* (2013.01); *H01L 29/735* (2013.01); *H01L 27/0924* (2013.01); *H01L 29/0692* (2013.01); *H01L 29/4232* (2013.01)

(58) Field of Classification Search
CPC ............ H01L 21/2018; H01L 21/2251; H01L 21/2254; H01L 21/76224; H01L 29/6625; H01L 21/8249; H01L 21/823418
USPC ................... 257/E21.102, E21.619, E21.431
See application file for complete search history.

(56) References Cited

U.S. PATENT DOCUMENTS

| 5,302,841 A | 4/1994 | Yamazaki |
|---|---|---|
| 5,440,152 A | 8/1995 | Yamazaki |

(Continued)

OTHER PUBLICATIONS

B.M. Wilamowski et al., Bipolar Junction Transistor, Industrial Electronics Handbook, vol. 1—Fundamentals of Industrial Electronics, 2d Edition, Ch. 9, pp. 9-1 to 9-20, CRC Press 2011.

(Continued)

*Primary Examiner* — Cory Eskridge
(74) *Attorney, Agent, or Firm* — Yuanmin Cai; Andrew M. Calderon; Roberts Mlotkowski Safran Cole & Calderon P.C.

(57) ABSTRACT

A lateral bipolar junction transistor is fabricated using a semiconductor-on-insulator substrate. The transistor includes a germanium gradient within a doped silicon base region, there being an increasing germanium content in the direction of the collector region of the transistor. The use of a substrate including parallel silicon fins to fabricate lateral bipolar junction transistors facilitates the inclusion of both CMOS FinFET devices and lateral bipolar junction transistors having graded silicon germanium base regions on the same chip.

14 Claims, 16 Drawing Sheets

(51) Int. Cl.
    *H01L 29/06*     (2006.01)
    *H01L 29/423*     (2006.01)
    *H01L 27/092*     (2006.01)

(56) References Cited

U.S. PATENT DOCUMENTS

| | | | |
|---|---|---|---|
| 6,750,483 B2 | 6/2004 | Klein | |
| 7,018,901 B1* | 3/2006 | Thean et al. | 438/285 |
| 7,019,341 B2 | 3/2006 | Lippert | |
| 7,348,250 B2 | 3/2008 | Freeman | |
| 7,719,031 B2 | 5/2010 | Saitoh | |
| 8,558,282 B1* | 10/2013 | Cai | H01L 29/6625 257/197 |
| 8,900,958 B2* | 12/2014 | Tsai et al. | 438/300 |
| 9,053,965 B2* | 6/2015 | He | H01L 21/82343 |
| 2006/0043498 A1* | 3/2006 | Orlowski | H01L 29/0847 257/396 |
| 2006/0099752 A1* | 5/2006 | Xiang | H01L 29/66636 438/197 |
| 2007/0178650 A1* | 8/2007 | Chen | H01L 29/165 438/301 |
| 2010/0038679 A1* | 2/2010 | Chan | H01L 29/66795 257/190 |
| 2011/0241073 A1* | 10/2011 | Cohen | H01L 21/82341 257/192 |
| 2011/0291189 A1* | 12/2011 | Cheng | H01L 29/66772 257/347 |
| 2012/0139009 A1* | 6/2012 | Ning | H01L 29/7317 257/197 |
| 2012/0193708 A1* | 8/2012 | Flachowsky | H01L 21/2254 257/335 |
| 2014/0084351 A1* | 3/2014 | Huang | H01L 29/66477 257/288 |
| 2014/0151761 A1* | 6/2014 | Hsieh et al. | 257/288 |
| 2014/0191330 A1* | 7/2014 | Cheng | H01L 21/82343 257/390 |
| 2014/0252475 A1* | 9/2014 | Xu | 257/347 |
| 2014/0264596 A1* | 9/2014 | He | H01L 21/82343 257/347 |
| 2014/0264603 A1* | 9/2014 | He | H01L 21/82343 257/347 |
| 2015/0035069 A1* | 2/2015 | Hung et al. | 257/369 |
| 2015/0102348 A1* | 4/2015 | Cai et al. | 257/69 |
| 2015/0108590 A1* | 4/2015 | Alptekin et al. | 257/411 |
| 2015/0140756 A1* | 5/2015 | Yu | H01L 29/66795 438/275 |
| 2015/0200128 A1* | 7/2015 | Jacob | H01L 21/76224 438/424 |
| 2015/0214338 A1* | 7/2015 | Cheng | H01L 29/66795 257/194 |
| 2015/0287642 A1* | 10/2015 | Chang | H01L 21/8249 438/236 |
| 2015/0287650 A1* | 10/2015 | Chang | H01L 21/225 438/236 |

OTHER PUBLICATIONS

Tak H. Ning et al., On the Performance and Scaling of Symmetric Lateral Bipolar Transistors on SOI, IEEE Journal of the Electron Devices Society, vol. 1, No. 1, Jan. 2013, pp. 21-27.

* cited by examiner

LATERAL BIPOLAR JUNCTION TRANSISTOR HAVING GRADED SIGE BASE

FIELD

The present disclosure relates to the physical sciences, and, more particularly, to bipolar junction transistors and methods of fabrication thereof.

BACKGROUND

Bipolar junction transistors include emitter, collector and base regions. A biasing voltage applied between a base contact and an emitter contact allows control of collector current. Bipolar junction transistors can be employed in applications such as switches or amplifiers. Depending on the doping types associated with the base, emitter and collector regions, bipolar junction transistors may operate as p-n-p transistors or n-p-n transistors. A heterojunction bipolar transistor, which is a type of bipolar junction transistor, operates based on a bandgap difference between the emitter and base. Significant current gains can be obtained through the use of heterojunction bipolar transistors.

Some types of field effect transistors (FETs) have three-dimensional, non-planar configurations including fin-like structures extending above substrates. Such field effect transistors are referred to as FinFETs. The substrates may include semiconductor on insulator (SOI) substrates or bulk semiconductor substrates. Silicon fins are formed in some FinFETs on substrates via known technology such as sidewall image transfer (SIT). FinFET structures including SOI substrates can be formed, in part, by selectively etching the crystalline silicon layers down to the oxide or other insulating layers thereof following photolithography. Active fin heights are set by SOI thickness when employing SOI substrates. In bulk FinFETs, active fin height is set by oxide thickness and etched fin height. The gates of FinFETs can be formed using a "gate-first" process wherein a gate stack and spacers are formed prior to selective epitaxial growth wherein source and drain regions are enlarged. A "gate-last" process may alternatively be employed wherein the source/drain regions are formed immediately following fin patterning. Gate-last procedures can involve making a dummy gate, fabricating other elements of the transistor, removing the dummy gate, and replacing the removed dummy gate with actual gate materials.

SUMMARY

Principles of the present disclosure provide an exemplary fabrication method that includes obtaining a structure comprising a plurality of parallel silicon fins adjoining an electrically insulating layer and a dummy gate extending across a plurality of the silicon fins. The fins define a channel region having a first conductivity type beneath the dummy gate. The structure further includes a source region on a first side of the dummy gate and a drain region on a second side of the dummy gate. Germanium is diffused into the channel region of the structure to form a germanium gradient within the channel region. Germanium content within the channel region increases in the direction of the drain region. The drain region is removed. Subsequent to forming the germanium gradient within the channel region, a silicon region is epitaxially grown on the second side of the dummy gate. The silicon region is grown from the fins within the channel region subsequent to forming the germanium gradient. The method further includes doping the silicon region such that the silicon region has a second conductivity type opposite to the first conductivity type, replacing the dummy gate with a gate structure operatively associated with the channel region, and forming electrical connections to the gate structure and the silicon region.

A lateral bipolar junction transistor in accordance with an exemplary embodiment includes a substrate including an electrically insulating layer, a doped silicon base region adjoining the electrically insulating layer and having a first conductivity type, and a doped silicon emitter region adjoining the electrically insulating layer and the base region, the doped silicon emitter region having a second conductivity type. A doped silicon collector region adjoin the electrically insulating layer and the base region and has the second conductivity type. A germanium gradient within the doped silicon base region has an increasing germanium content in the direction of the collector region. A gate structure is operatively associated with the doped silicon base region.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Lateral bipolar junction transistors (LBJTs) and fabrication methods as disclosed herein can provide substantial beneficial technical effects. For example, one or more embodiments may provide one or more of the following advantages:

High drive current per device width;
High current per layout area;
Current gain comparable to vertical bipolar junction transistors without polysilicon emitters;
High frequency operation feasible;
Integratable with FinFET CMOS process flow.

These and other features and advantages will become apparent from the following detailed description of illustrative embodiments thereof, which is to be read in connection with the accompanying drawings.

DETAILED DESCRIPTION

Lateral bipolar junction transistors having graded germanium content in the base portions thereof are provided, thereby boosting current gain. The bipolar junction transistors are formed in some embodiments using, in part, technology that is also employed for forming FinFET structures. FinFET structures are characterized by fins formed on semiconductor substrates. Such substrates include bulk silicon substrates (fin on bulk) and SOI substrates (fin on SOI) as discussed above. The processes discussed below relate to fabrication of electronic devices from SOI substrates, though bulk silicon substrates may alternatively be employed. FIGS. 1-9 illustrate exemplary steps that may be performed sequentially in fabricating lateral bipolar junction transistors, it being appreciated that additional steps may be necessary depending on the desired features of the structures. Fabrication may commence with a partially completed structure, in which case one or more of the steps described below could be omitted. Fabrication of the lateral bipolar junction transistors as described below is accompanied in some embodiments by fabrication of CMOS FinFET devices on the same chip.

Figure 1A:
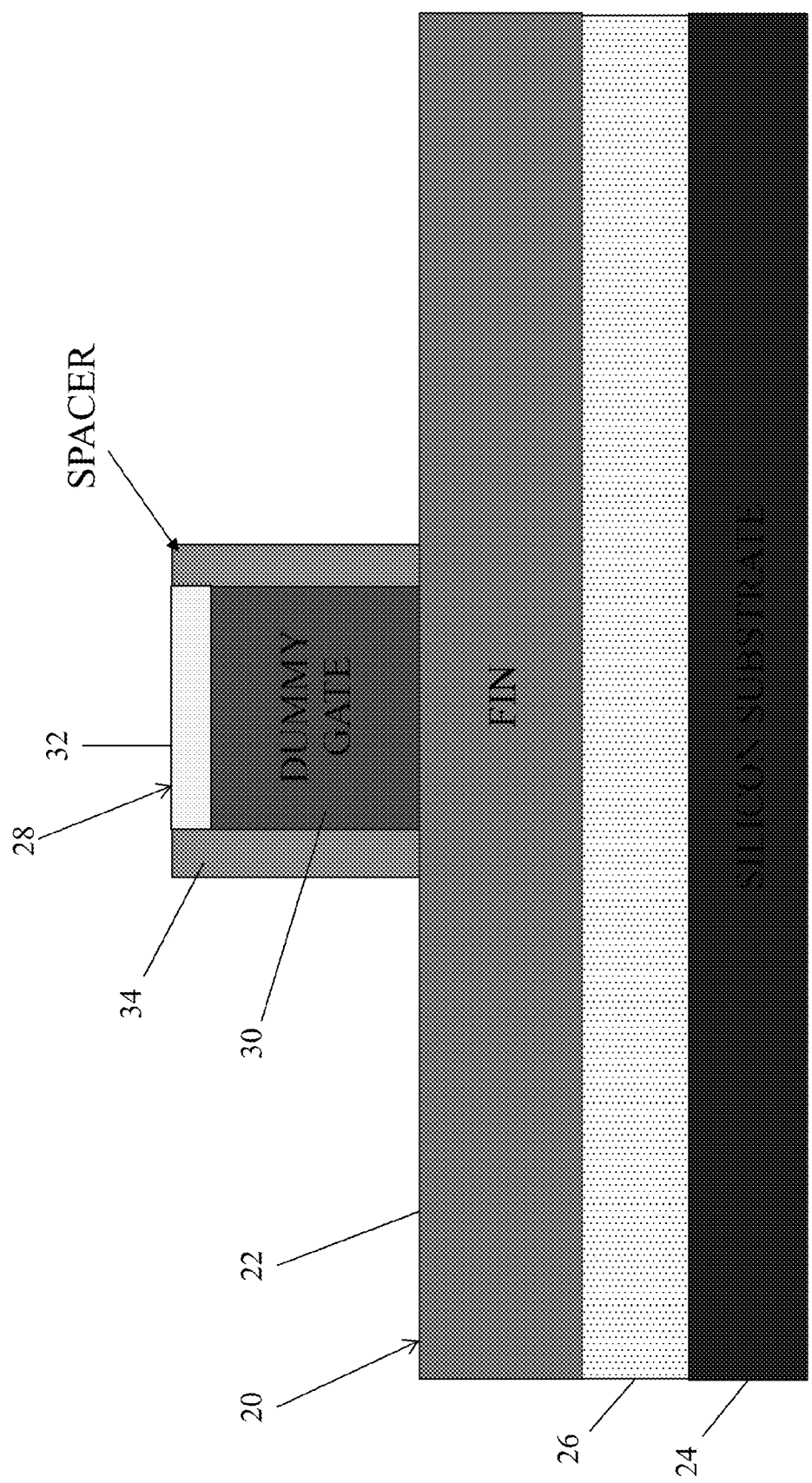
FIG. 1A is a schematic sectional illustration of a FinFET structure following formation of a dummy gate.
Figure 1B:
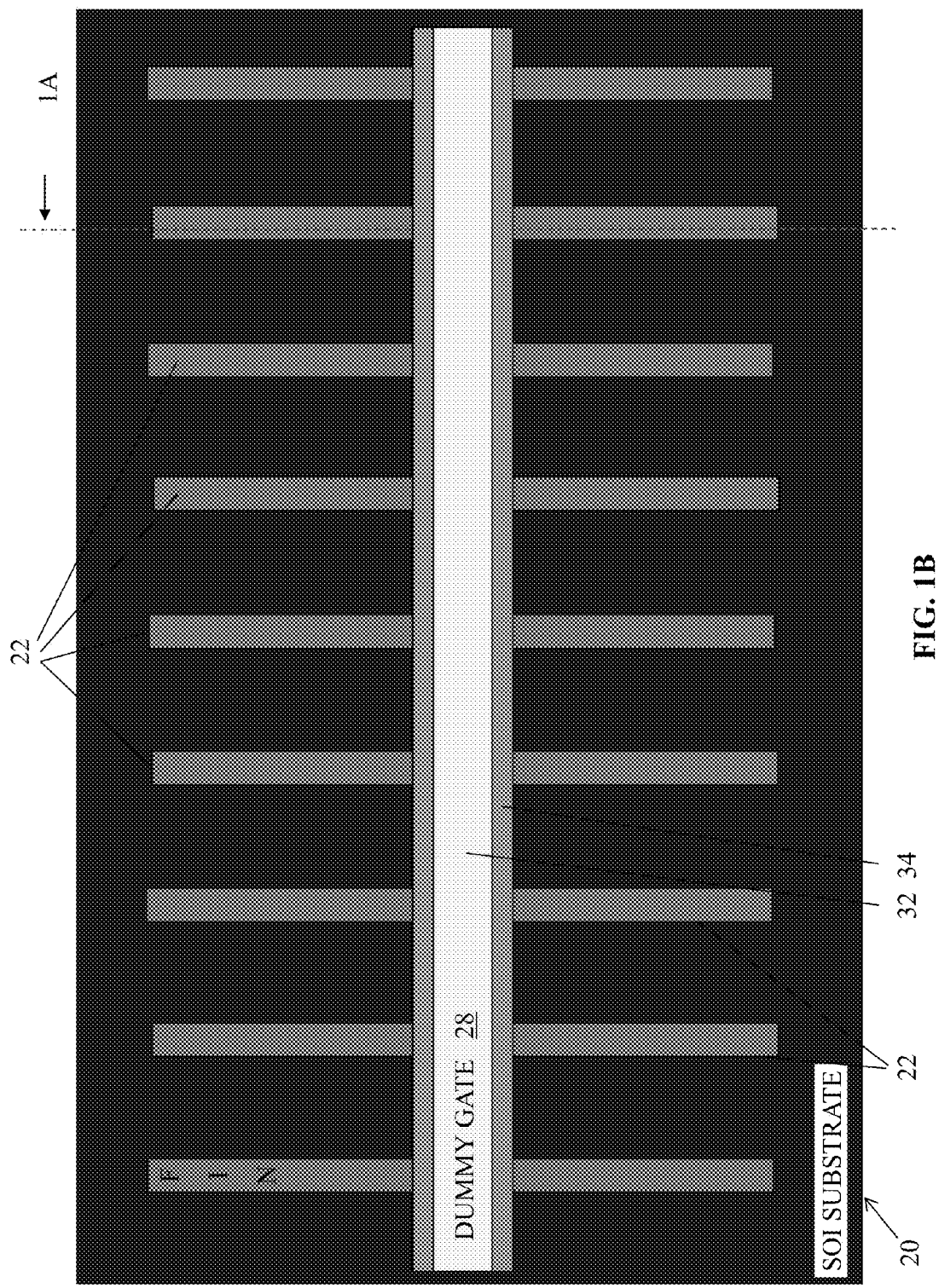
FIG. 1B is a top plan view of the structure shown in FIG. 1A.

A SOI substrate comprised of essentially undoped crystalline silicon is employed for forming a finned structure 20 as shown in FIGS. 1A and 1B, it being appreciated that standard silicon substrates may have a very low level of p-doping. The substrate may be in the form of a wafer. The finned structure includes an array of parallel silicon fins 22 formed from the SOI layer of the substrate, a substrate layer 24 that functions as a handle, and an electrically insulating layer 26 such as a buried oxide layer. The electrically insulating layer 26 in one exemplary embodiment is a high quality silicon dioxide layer that is thermally grown, though other buried insulators such as boron nitride (BN) and aluminum oxide ($Al_2O_3$) may alternatively be employed in some embodiments. High quality buried oxides are generally characterized by relatively low interface trap densities ($D_{it}$). Fin heights, widths and spacing are further chosen in accordance with manufacturer preferences. Fin heights in some embodiments range between 10-60 nm. As discussed above, fin heights correspond to the thickness of the SOI layer from which they are formed. The side walls of the fins 22 may not be exactly vertical and instead converge towards the tops of the fins. Exposed fin surfaces in one or more embodiments may be (110) surfaces or close to (110) surfaces, but may or may not be exactly (110) surfaces.

As further shown in FIGS. 1A and 1B, a sacrificial "dummy" gate 28 is formed on a portion of the finned structure 20 and extends perpendicularly to the fins 22. The sacrificial gate is a structure that defines the geometry of a later formed gate structure that operates the semiconductor device once the dummy gate is removed and the gate structure that operates the semiconductor device is formed in its place, as described further below. The dummy gate is removed in a later process familiar to those of skill in the art and a replacement metal gate composition is patterned at an appropriate stage of the transistor fabrication process. In one exemplary embodiment, the sacrificial dummy gate 28 is comprised of a sacrificial gate oxide 30 on the SOI layer that includes the fins 22 and a dielectric cap 32 on top of the polysilicon layer. The disclosed sacrificial gate materials are considered exemplary as opposed to limiting. Other suitable material or combinations of materials familiar to those of skill in the art may alternatively be employed. Spacers 34 are formed on the sidewalls of the gate. The spacers are formed by depositing a dielectric material different from the material used for the cap 32 in one or more embodiments to allow for subsequent selective etching of the cap 32 and spacers 34. For example, if the cap 32 comprises a silicon nitride layer, the spacers 34 can include silicon oxide. The dielectric spacers 34 are formed in some embodiments by depositing a layer of dielectric material on the structure and anisotropically etching the layer. The dummy gate 28 is formed on the channel region of the silicon fins. The region adjoining a first side of the channel region is referred herein to as a source region while the region adjoining the opposite side of the channel region is referred to as a drain region, it being appreciated that at least the drain region is removed during fabrication and replaced by an epitaxial region that functions as the drain (collector) region of the lateral bipolar junction transistor obtained.

Figure 2A:
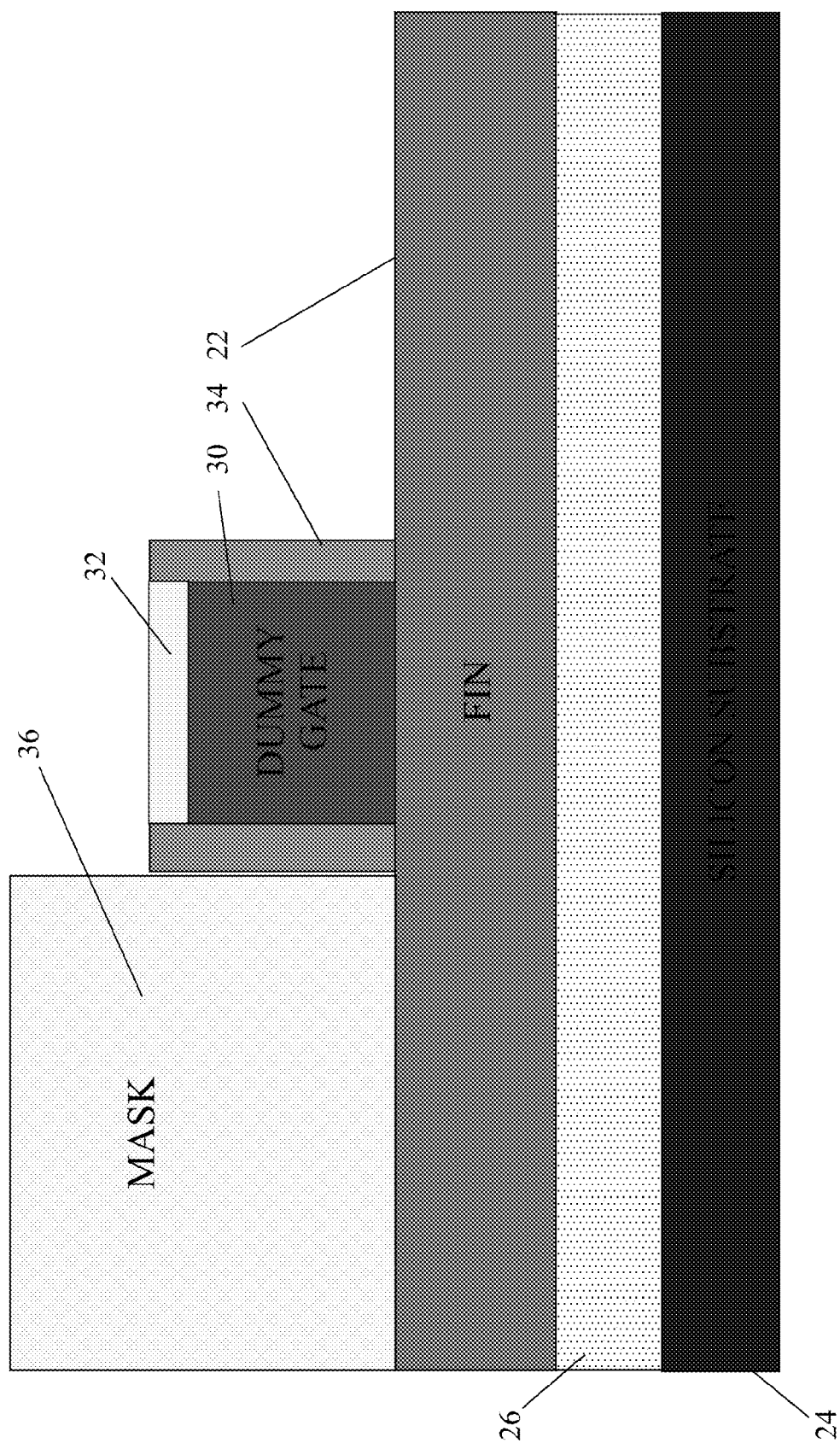
FIG. 2A is a schematic sectional illustration of the structure shown in FIG. 1A including a mask formed thereon.
Figure 2B:
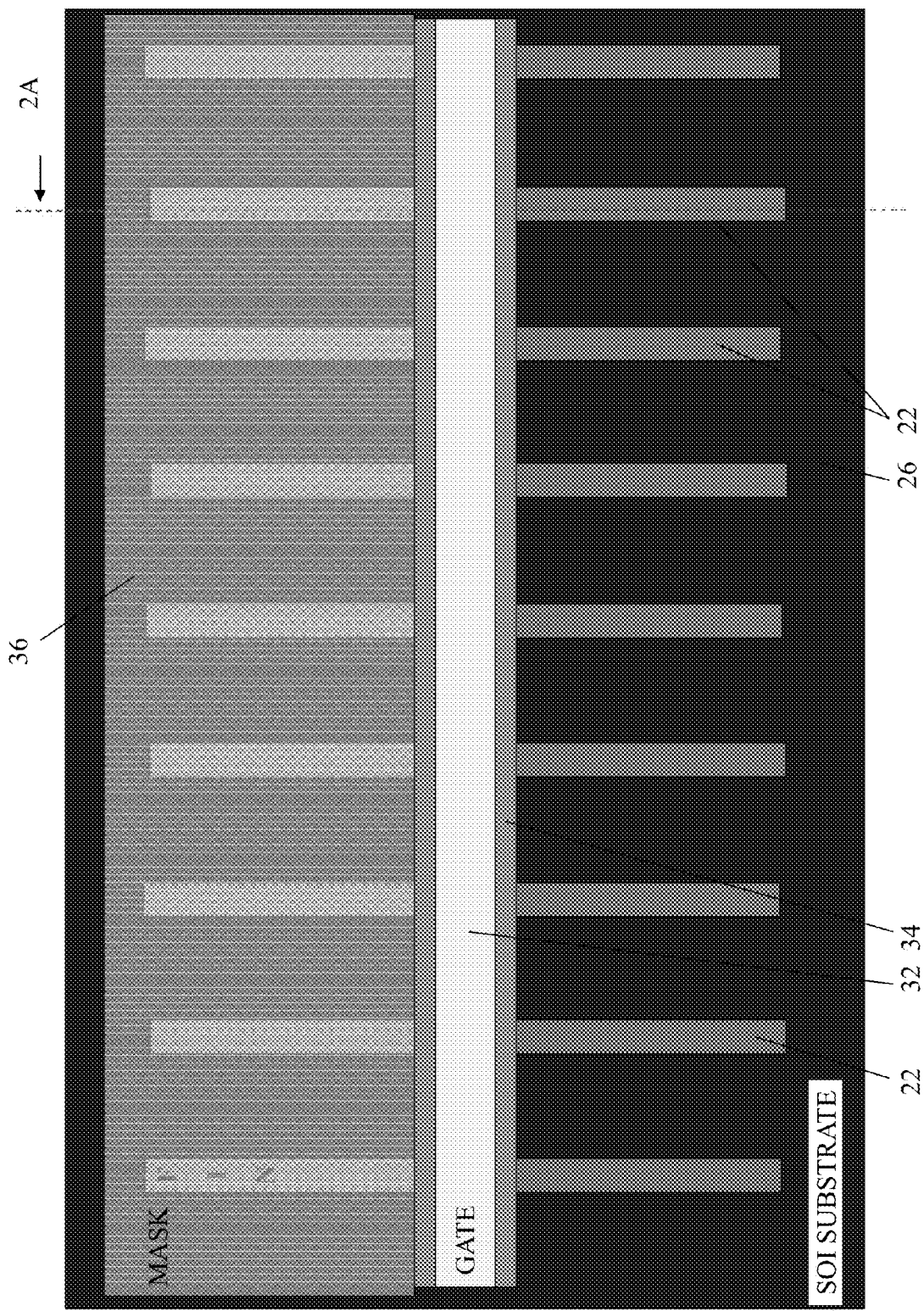
FIG. 2B a top plan view of the structure shown in FIG. 2A.

Referring to FIGS. 2A and 2B, a mask 36 is formed over the source region of the lateral bipolar junction transistor to be formed using the SOI substrate. The source region thereof is accordingly protected while the drain region is exposed. The mask may also extend in part over the dummy gate 32, though such extension is not required. A nitride (silicon nitride ($Si_3N_4$)) hard mask is employed in one or more embodiments. Such a mask may be deposited using conventional deposition techniques such as spin-on coating, CVD, plasma-assisted CVD, or other known techniques. Conventional processes are further employed, such as applying and patterning a resist, etching, and removing resist, to remove a portion of the mask 36 from at least the region of the structure to be used as the drain region. Fins 22 in the drain region and the top surface of the underlying insulating layer 26 on one side of the dummy gate accordingly remain exposed. Hot phosphoric acid is an exemplary etchant that may be employed to remove selected portions of the mask 36.

Figure 3A:
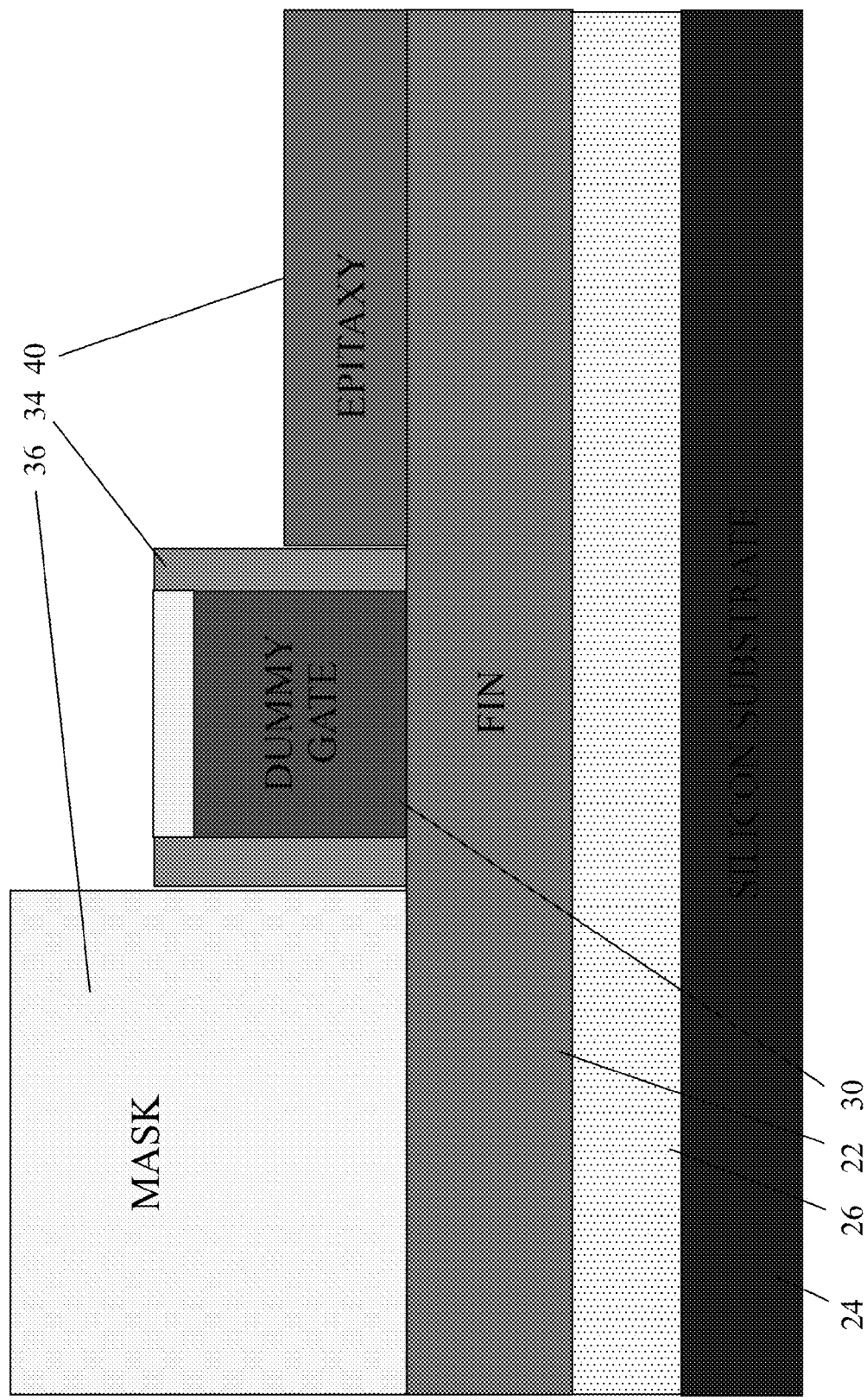
FIG. 3A is a schematic sectional illustration of the structure shown in FIG. 2A showing silicon germanium merge epitaxy in the drain region.
Figure 3B:
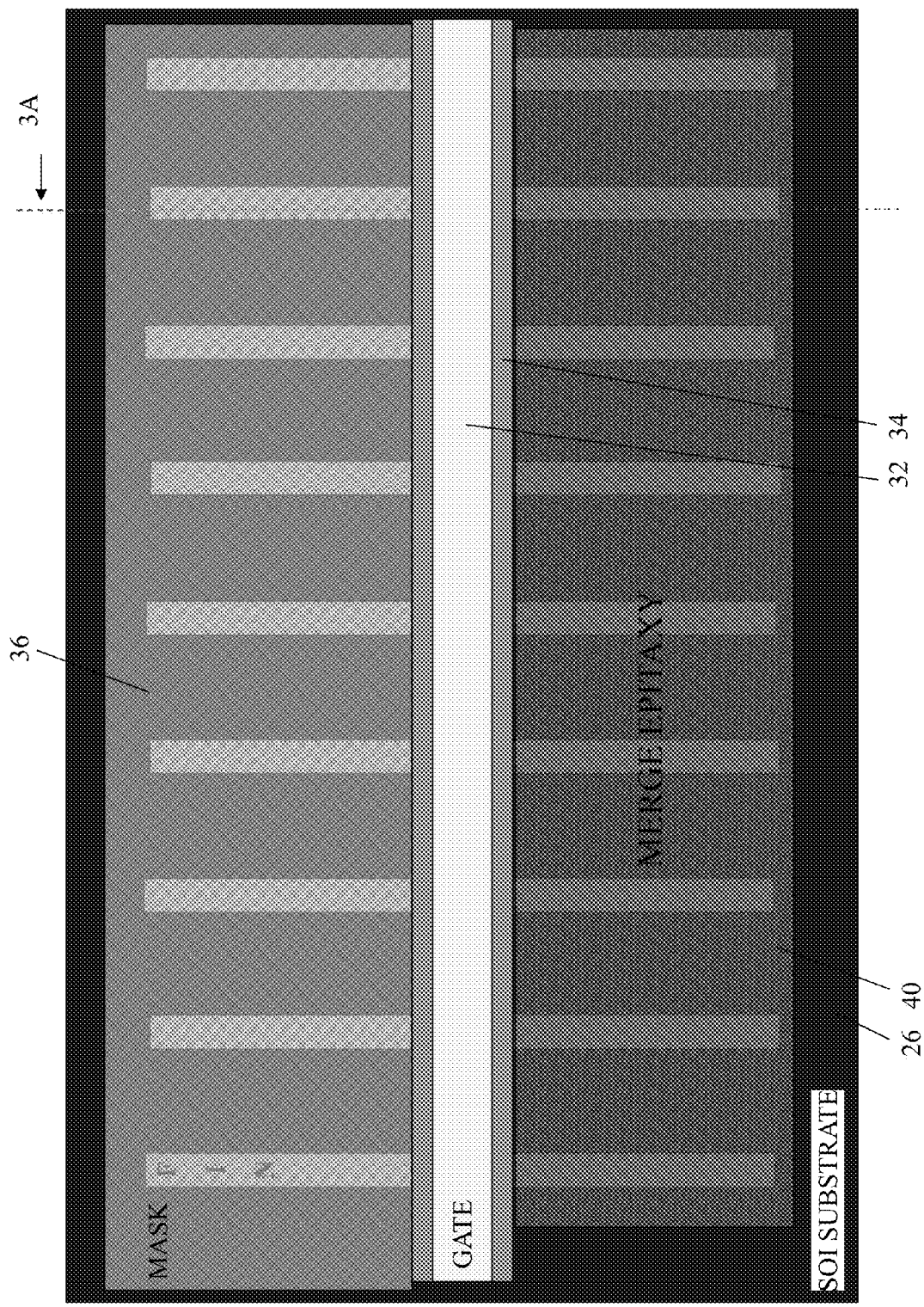
FIG. 3B a top plan view of the structure shown in FIG. 3A.

Referring to FIGS. 3A and 3B, a germanium-containing layer 40, preferably silicon germanium, is grown epitaxially, for example by chemical vapor deposition (CVD), on the fins 22 in the drain region. In one or more embodiments, the germanium-containing layer comprises 20-99% germanium, though more preferably 20-80% germanium. In other embodiments, the layer contains 30-60% germanium. The thickness of the germanium-containing layer in one or more embodiments is between five to twenty-five nanometers (5-25 nm). As will be appreciated from the discussion below, the germanium-containing layer should have sufficient thickness and sufficient germanium content that the channel (base) region of the lateral bipolar junction transistor to be fabricated contains an acceptable ratio of silicon and germanium.

Figure 4:
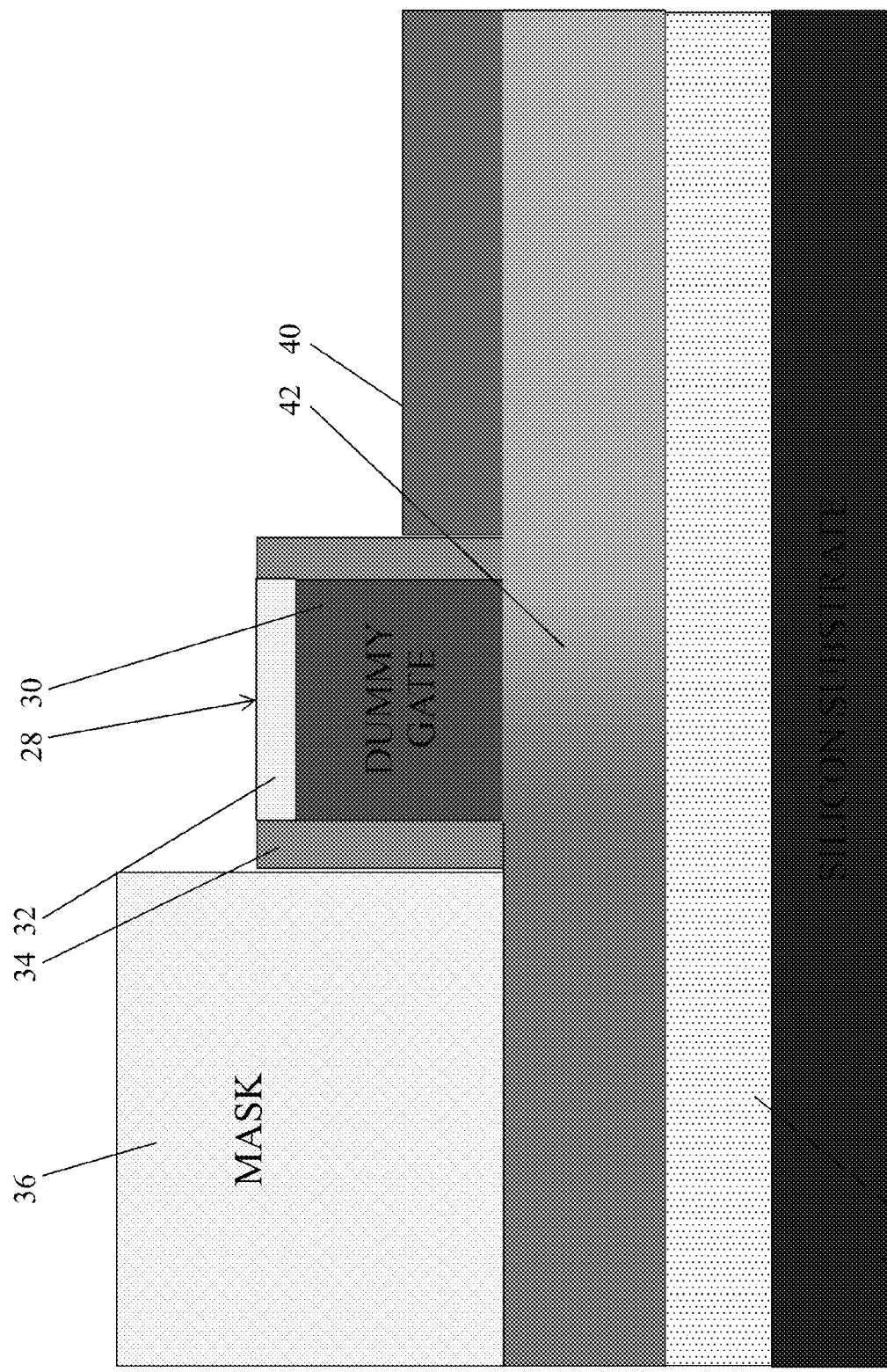
FIG. 4 is a schematic sectional illustration of the structure shown in FIG. 3 showing annealing of the structure to form a germanium gradient in the channel region.

The structure obtained following growth of the germanium-containing layer 40 shown in FIGS. 3A and 3B is annealed, resulting in the structure shown in FIG. 4. The anneal process can be furnace anneal, rapid thermal anneal, flash anneal, or any suitable combination of those processes. The anneal temperature ranges from 600 degrees to 1300 degrees Centigrade. The anneal time ranges from 1 millisecond to 2 hours, depending on the anneal temperature. Higher anneal temperatures require shorter anneal times. A typical thermal anneal condition is about thirty minutes at 1000° C. Such annealing causes the mixing of the germanium containing layer 40 and the layer of crystalline silicon fins 22 in the drain and channel regions of the structure. A region 42 including a germanium gradient is formed in the channel region beneath the dummy gate, there being an increasing germanium content in the direction of the drain region. In one or more embodiments, the region 42 extends all the way to the fin region on the opposite side of the dummy gate 28 that later functions as the source (emitter) region of a finished device. The fins 22 in the source region remain germanium-free in one or more embodiments. The germanium content of the silicon germanium layer 40 can be engineered as desired for particular applications by depositing a germanium containing layer 24 having an appropriate germanium content and/or thickness for the particular applications. The germanium gradient 42 in the channel (base) region is linear in one or more embodiments.

Figure 5:
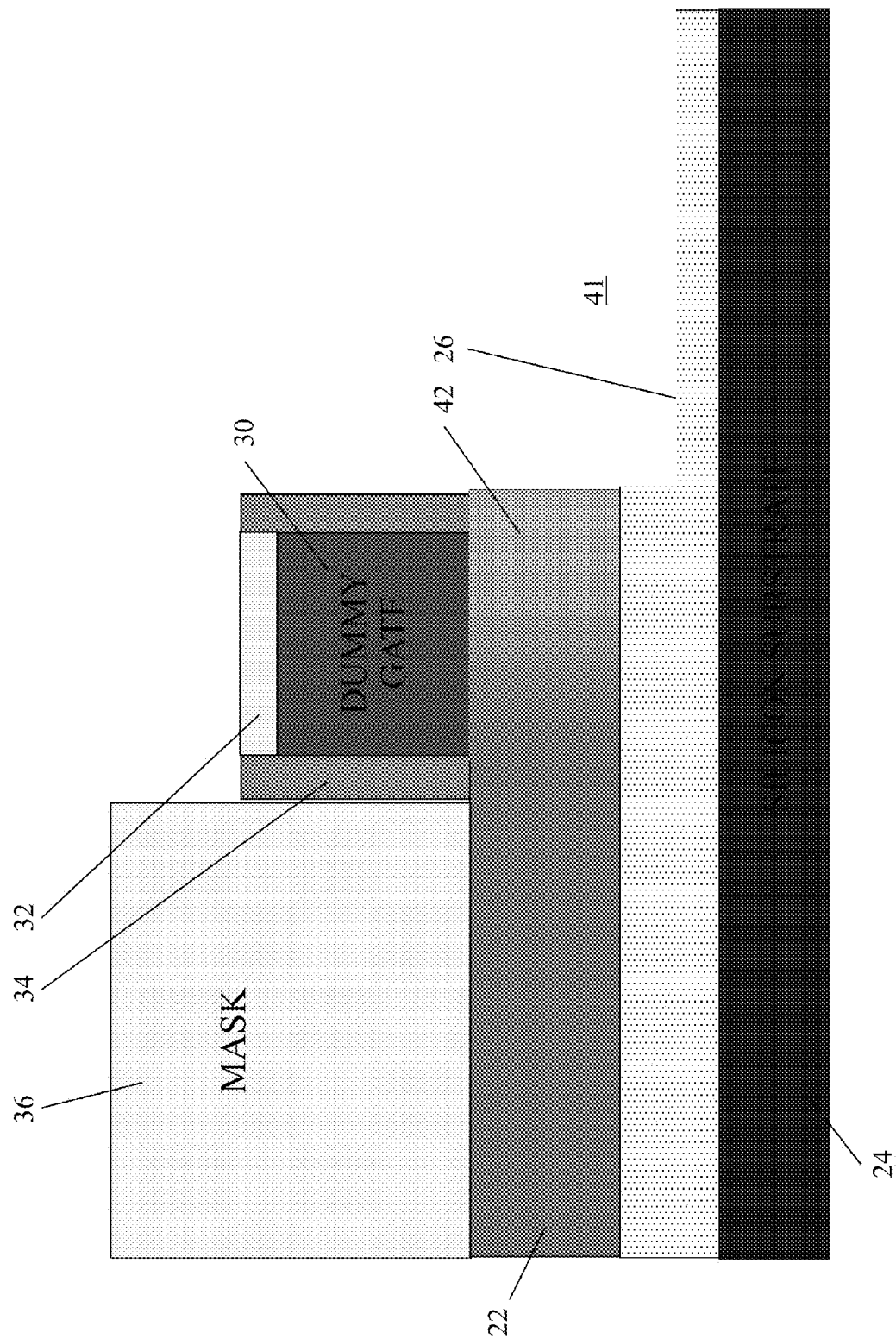
FIG. 5 is a schematic sectional illustration showing formation of a recess in the drain region of the structure shown in FIG. 4.

As shown in FIG. 5, a recess 41 is formed in the drain region of the structure obtained following thermal annealing. The germanium-containing layer 40, the portions of the silicon fins 22 in the drain region, and a portion of the electrically insulating layer 26 are all removed to form the recess. The channel region, including the region 42 thereof containing the germanium gradient, the dummy gate, and the mask 36 remain following formation of the recess. Reactive ion etch (RIE) is employed to form the recess 41 in one or more embodiments. The anisotropic etch is discontinued within the electrically insulating layer using techniques familiar to those of skill in the art, such as by detecting the presence of the electrically insulating material and/or employing a timed etch that stops before the entirety of the electrically insulating layer is removed. A portion of the electrically insulating layer 26 remains on the substrate following formation of the recess.

Figure 6:
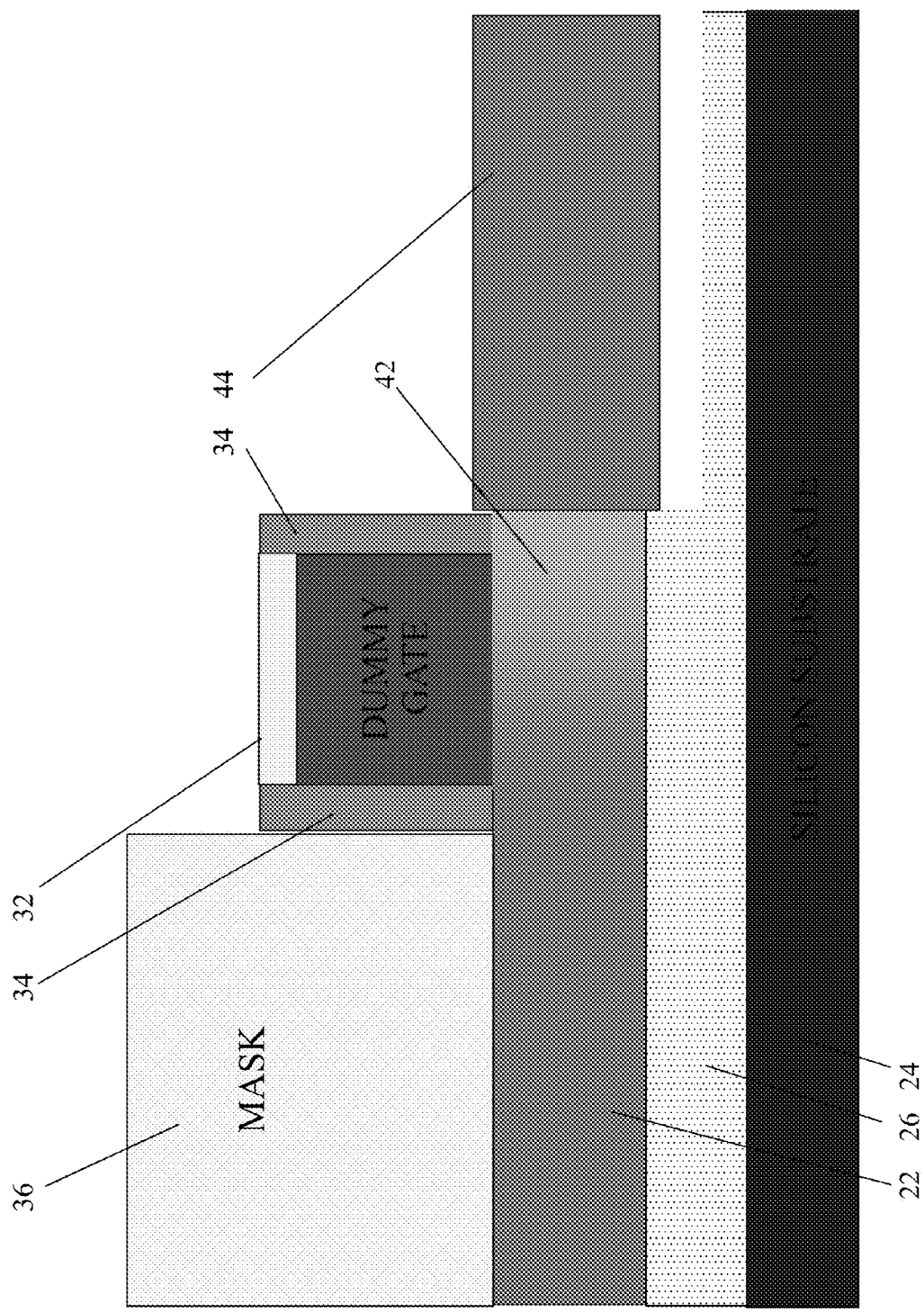
FIG. 6 is a schematic sectional illustration showing formation of a highly doped epitaxial silicon region in the drain region of the structure shown in FIG. 5.

A doped epitaxial silicon region 44 is grown on the exposed surfaces of the fins 22 located beneath the dummy gate, as shown in FIG. 6. Fin thickness (fin width) is between 5 and 50 nm in one or more embodiments. Fin pitch is between 20 and 100 nm and fin height is between 10 and 50 nm in one ore more embodiments. So long as there is some volume of the silicon fins exposed to the epitaxy, by tuning the epitaxy conditions such as temperature, pressure, flow, and time, a merged epitaxial region 44 can be formed for later use as a drain (collector) region. Epitaxy from fins 22 opposite to the illustrated fin may further provide seed material to effect merge of the epitaxial region 44. By tuning epitaxy conditions such as temperature, pressure, flow, and time, as known to those of skill in the art, it is further possible to grow the epitaxial region 44 selectively to the mask and exposed buried oxide on the field. The process ensures that epitaxy is only nucleated from the exposed SiGe fin regions, not other materials. Boron-doped silicon can be formed in one or more exemplary embodiments. Phosphorus-doped silicon (Si:P) is formed some exemplary embodiments. The doping level and type can be chosen as desired for particular transistor applications. As known in the art, n-type semiconductor regions are formed where the electrons are to function as the majority carriers while holes are the minority carriers. P-type semiconductor regions are formed in embodiments wherein the majority carriers are to be holes. Boron doping (for example, doping level greater than 1e18) may be provided to form a p+ region. In one or more exemplary embodiments, the dopant concentration is in the range of 1e19 to 2e20 $cm^{-3}$. The silicon region 44 directly contacts the region 42 containing the diffused germanium. In some exemplary embodiments, doping of the silicon region 44 is in situ during selective epitaxial deposition. Such doping can be effected by flowing a dopant gas including dopant atoms that will provide the appropriate conductivity type in the drain (collector) region of the lateral bipolar junction transistor to be fabricated. Silicon-containing reactant gases include but are not limited to $SiH_4$, $SiH_2Cl_2$, $SiCl_4$ and $Si_2H_6$. If an n-type silicon region 44 is to be formed, possible dopant gases include $PH_3$, $AsH_3$, $SbH_3$ and combinations thereof. One exemplary dopant gas for forming p-type silicon regions is $B_3H_6$. In one or more embodiments, the selective epitaxial growth of the silicon region 44 is at a temperature exceeding 500° C.

If the silicon region 44 is deposited as intrinsic silicon, doping may be effected by implanting dopants to obtain the desired conductivity type and doping level. In such embodiments, the source region may be simultaneously doped with the silicon region 44 while protecting the channel region and dummy gate with a hard mask. The source (emitter) and drain (collector) regions of the transistor to be fabricated will have the same conductivity type. The channel (base) region has a conductivity type opposite from that of the source and drain regions. Heterojunctions are accordingly formed at the interfaces between the emitter and base regions and between the base and collector regions of the subsequently formed lateral bipolar junction transistor. Dopants can alternatively be implanted within the source and/or channel regions prior to formation of the dummy gate using hard masks to protect selected areas of the structure while leaving others exposed. Alternatively, lithographic techniques can be employed using a soft mask (photoresist) and implanting each desired region separately. A further approach for providing dopants includes first, after the diffusion of germanium, using ion implantation while the base (channel) region is protected by the dummy gate, thereby implanting both source and drain regions to achieve source target doping. Since the collector (drain) region is etched later, this ensures the correct source doping level is obtained. Collector doping is determined later by silicon epitaxy or masked implantation. Dummy dielectric is then deposited as a blanket and subjected to chemical mechanical polishing (CMP) that stops on the dummy gate. The dummy gate is then removed and the base (channel) region is implanted while the source and drain regions are protected by the dummy dielectric layer. As the drain region of the structure 20 is eventually removed, doping thereof is optional. A further possible alternative would involve removing fin material from both the source and drain regions rather than just the drain region, leaving the channel in place. Doped source and drain regions would be epitaxially grown on the exposed channel surfaces on both sides of the channel.

The Kirk effect is a phenomenon associated with bipolar junction transistors and can cause an increase in the base transit time thereof. Increased base transit time reduces current gain (β) and transit frequency at high collector currents. The conditions for generating Kirk effect may be expressed by the formula $J_{max}=q\ v_{sat}\ N_C$ where $v_{sat}$ is saturation velocity, $N_C$ is collector charge density, and $J_{max}$ is the maximum collector current density. A rule of thumb for avoiding the Kirk effect is to operate at $0.3\ J_{max}$ or lower. In one or more embodiments wherein the starting substrate is a partially depleted semiconductor-on-insulator (PDSOI) substrate having an SOI layer thickness of about fifty nanometers (50 nm), a current of 5 mA/μm is targeted and J will be 100 mA/μm². A collector doping density (e.g. n-type) of $2\times10^{19}$ cm$^{-3}$ is employed in such exemplary embodiments, which is about one order of magnitude less than the doping level of a typical n+ emitter. Considerations in addition to avoiding Kirk effect are given to other factors that relate to transistor performance. In order to provide reasonable current gain (β), base doping should be higher than collector doping and emitter doping should be higher than base doping. Depending on the intended application for a lateral bipolar junction transistor as disclosed herein, current gain may be sacrificed by employing a base doping level that is less than the collector doping level. A value of β of about ten (10) should be sufficient for one or more applications. In some embodiments, base doping is about 1e19 cm$^{-3}$, both emitter and collector doping is greater than 1e20 cm$^{-3}$ and the transistor is symmetrical. Symmetrical lateral bipolar junction transistors provide equal speed in forward-active and reverse-active modes.

Figure 7:
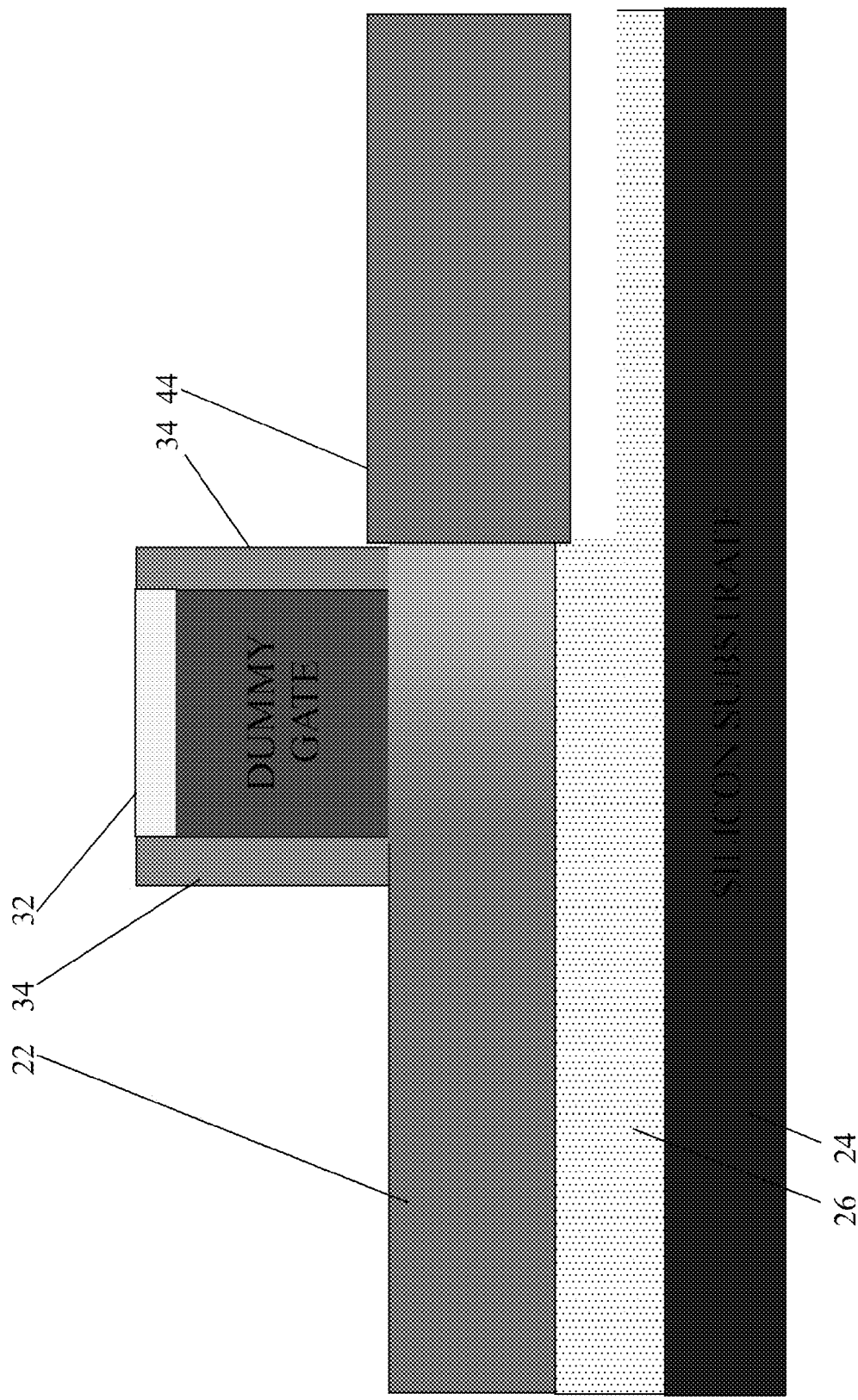
FIG. 7 is a schematic sectional illustration showing removal of the mask from the structure shown in FIG. 6.
Figure 8:
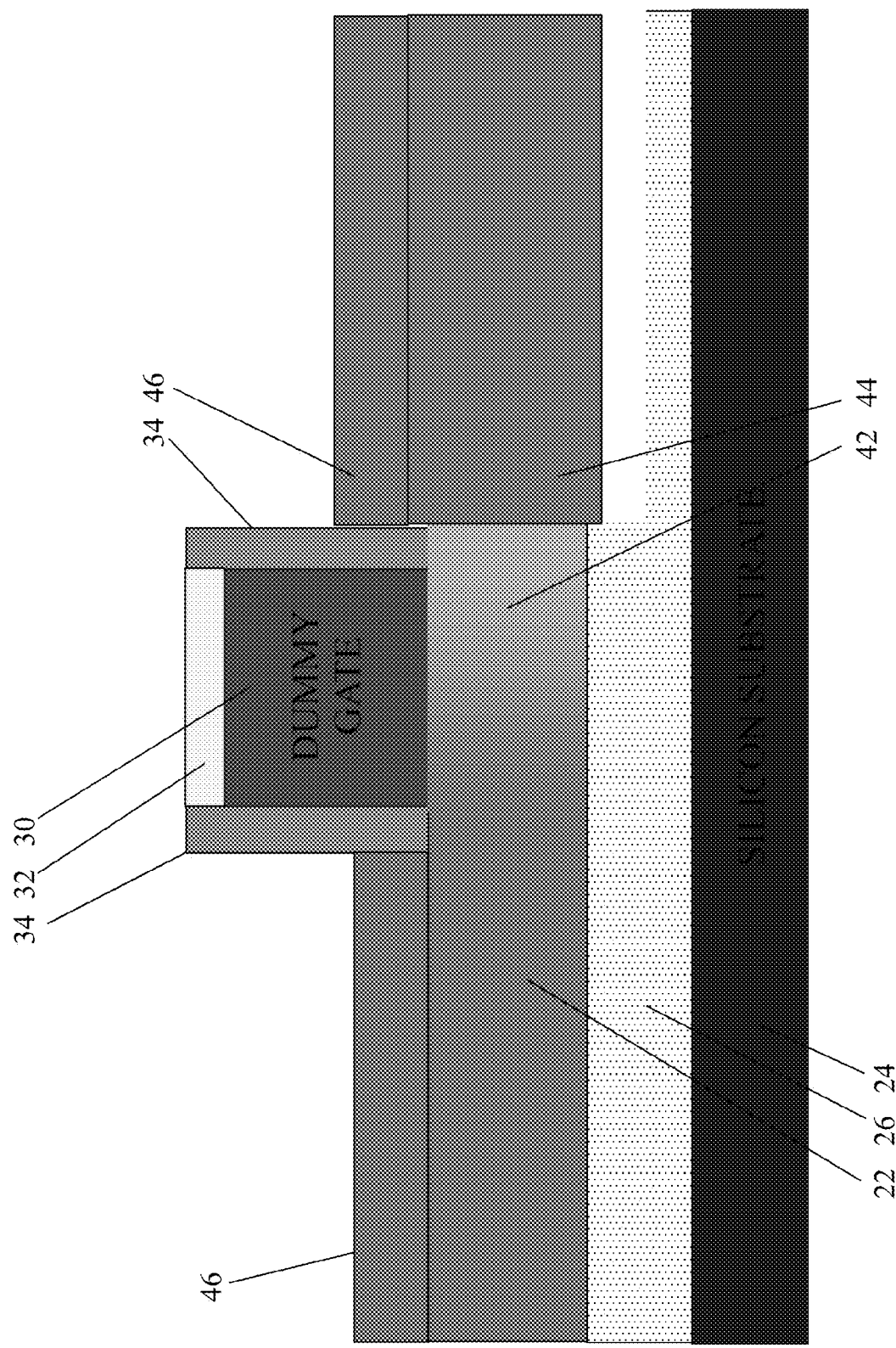
FIG. 8 is a schematic sectional illustration showing growth of a silicon region on both the source and drain regions of the structure shown in FIG. 7.

Referring to FIG. 7, the hard mask 36 is removed from the structure using hot phosphoric acid if the hard mask is a nitride mask. Other suitable mask removal techniques may be employed depending on the composition of the mask. A silicon layer 46 is grown epitaxially on the fins 22 as shown in FIG. 8. The epitaxial silicon layer 46 grows on both the source region, which is unmerged at the time the silicon layer 46 is deposited, and the drain region, which is a merged structure that adjoins a plurality of the fins 22. Merging in the source region is optional. An object of this step is to provide enough dopant to improve contact resistivity. The high doping level of the electrically conductive silicon layer 46 (n+, and a doping level of $1\times10^{20}$ cm$^{-3}$ or more in exemplary embodiments) is sufficient to improve contact resistivity. Dopants are provided in situ during deposition of the silicon layer 46 in one or more embodiments.

Figure 9:
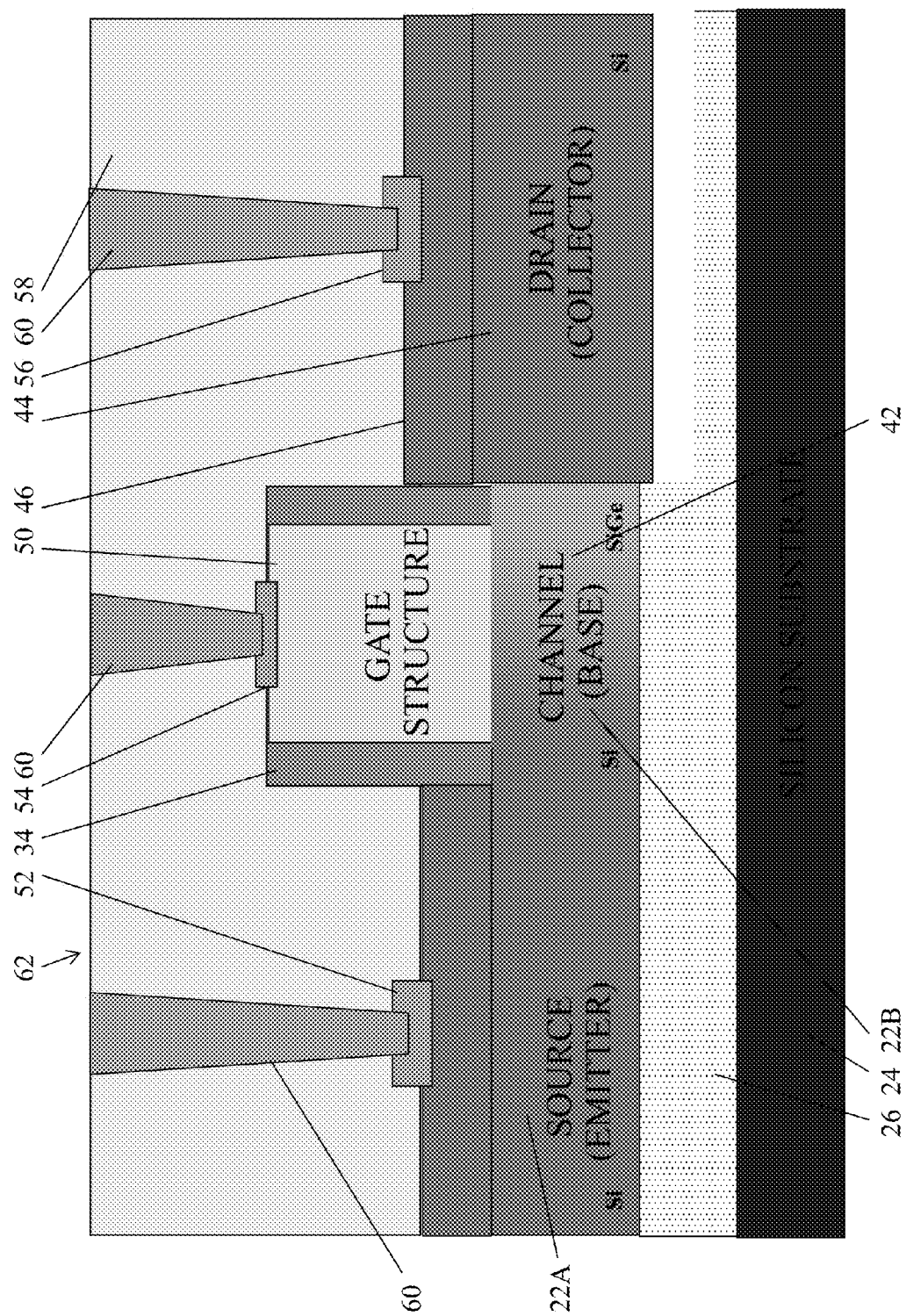
FIG. 9 is a schematic sectional illustration showing formation of a gate structure, source and drain electrodes, and a dielectric layer on the structure shown in FIG. 8.

The dummy gate is removed in a process familiar to those of skill in the art and a replacement base material 50 is patterned at an appropriate stage of the transistor fabrication process to form a gate structure operatively associated with the base (channel) region 22B. Emitter, base and collector electrodes 52, 54, 56 are formed. The base and collector electrodes directly contact the highly doped silicon layer 46. The base electrode is formed on the base material 50. Doped poly-Si having a doping density of $1\times10^{20}$ cm$^{-3}$ or more is employed as the base material 50 in one or more embodiments. Conventional back-end-of-line (BEOL) processing is employed in one or more embodiments to form a dielectric layer 58 containing metal layer(s) (not shown) and via conductors 60. Oxide, nitride, and oxynitride materials are among the materials that may comprise the dielectric layer 58. Metallization processes using, for example, copper or aluminum to form the via conductors and metal layer(s), are well known to the art. A lateral bipolar junction transistor 62 having a conduction band gradient that accelerates the transport of electrons injected from the emitter region 22A across the base region 22B, such as shown in the exemplary structure of FIG. 9, is accordingly provided. The fabrication of transistors such as the exemplary transistor 62 is scalable and can be fabricated using standard CMOS processing techniques. Such fabrication can be integrated with current FinFET CMOS process flow to provide CMOS FinFET devices (not shown) and LBJT devices on the same chip.

Figure 10:
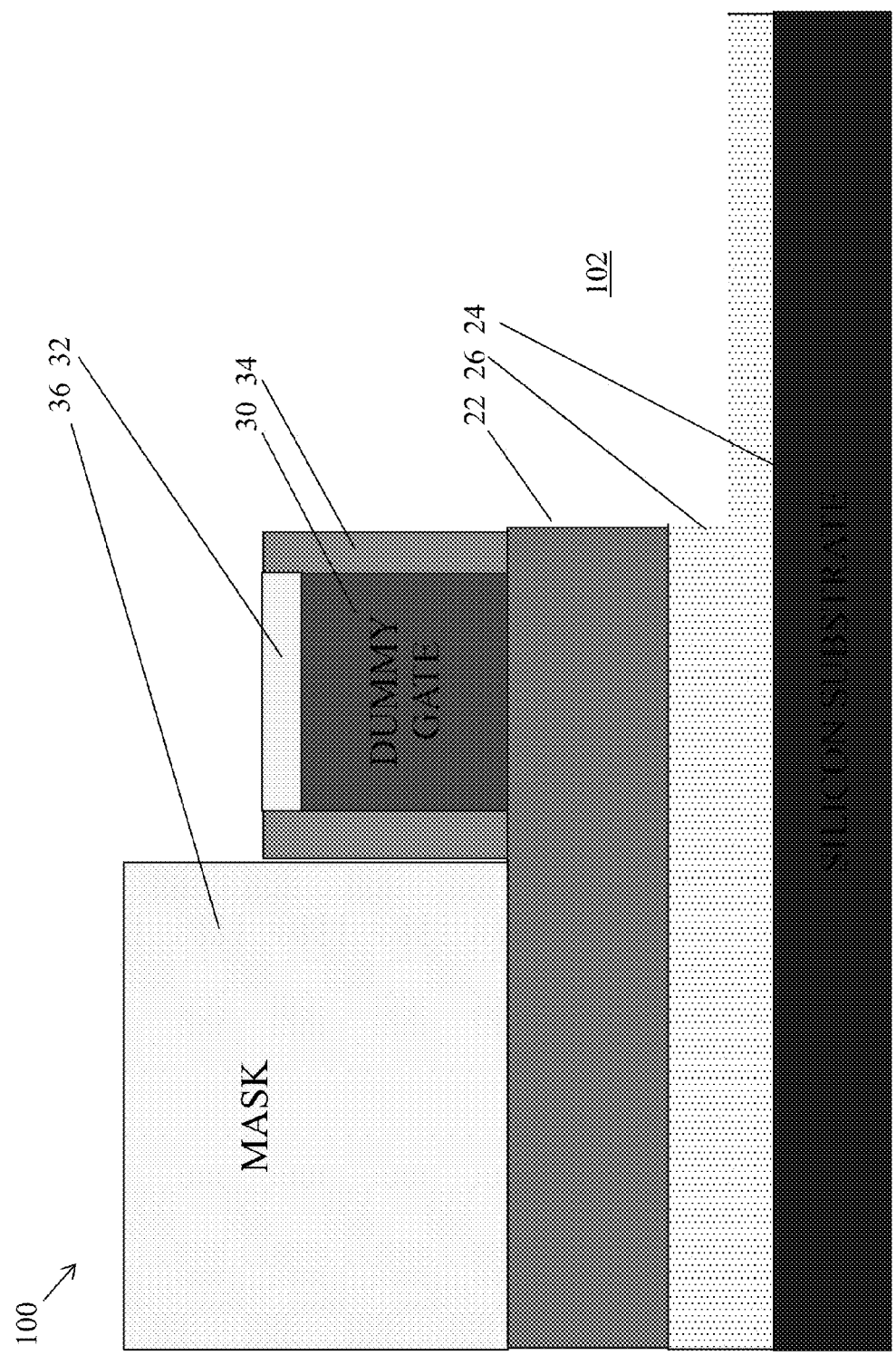
FIG. 10 is a schematic sectional illustration showing formation of a recess in the drain portion of the structure shown in FIG. 2.

Steps performed in an alternative exemplary fabrication process are schematically illustrated in FIGS. 10-13. The same reference numerals are employed as found in one or more of FIGS. 1-9 to designate similar elements. The alternative process includes obtaining a structure as described above with respect to FIG. 2. Once such a structure is obtained, a recess 102 is formed in the drain region to provide a structure 100 as shown in FIG. 10. The recess 102 extends into the electrically insulating layer and adjoins the channel region beneath the dummy gate. Reactive ion etching is employed in some embodiments to remove the silicon fins in the drain region and a portion of the underlying electrically insulating layer. Top down, one step RIE is employed in some embodiments to remove both the silicon and insulating (e.g. oxide) layers. In other embodiments, silicon RIE is followed by oxide RIE in a two-step anisotropic process.

Figure 11:
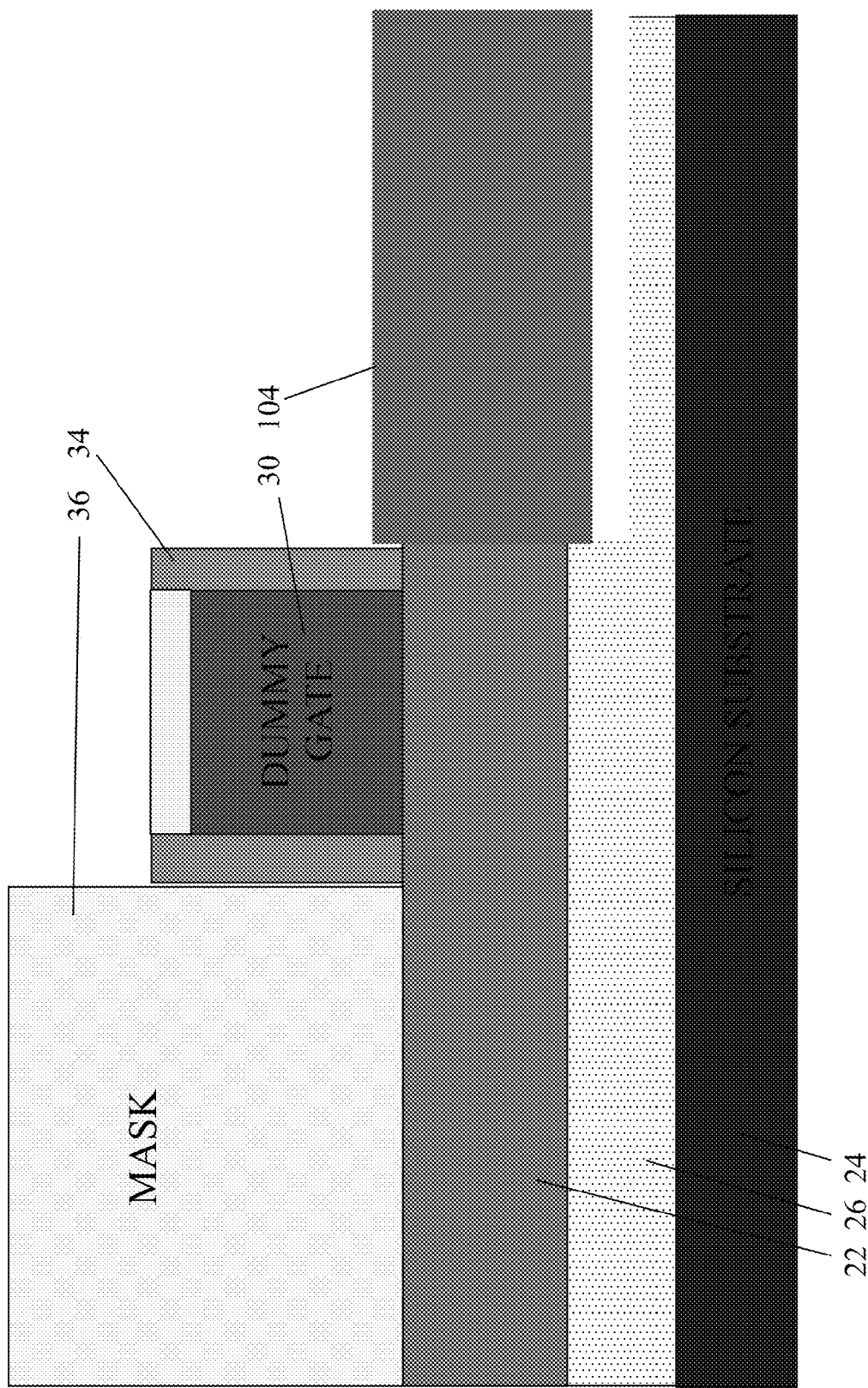
FIG. 11 is a schematic sectional illustration showing formation of a germanium layer in the drain portion of the structure shown in FIG. 11.
Figure 12:
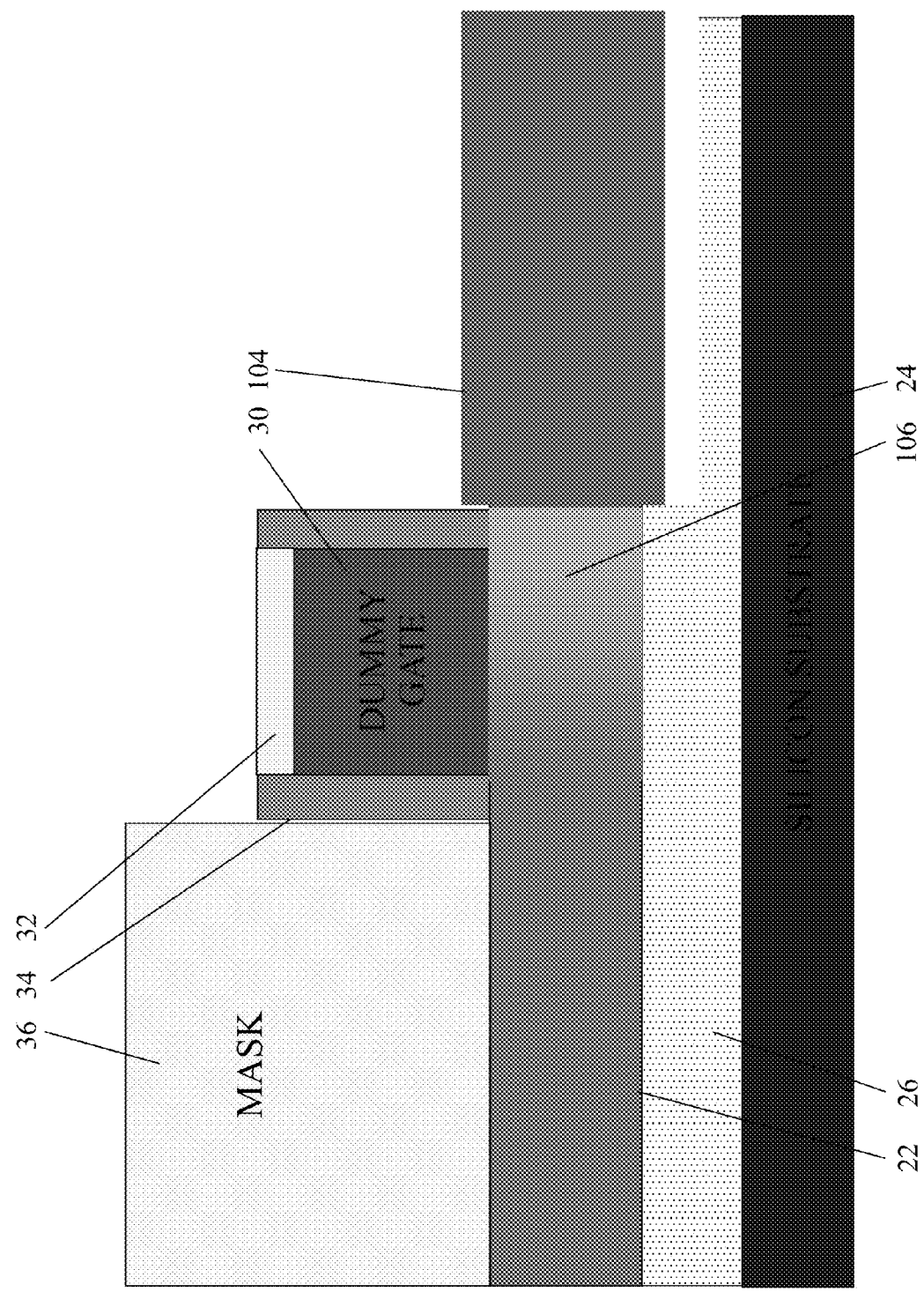
FIG. 12 is a schematic sectional illustration of the structure shown in FIG. 11 showing annealing of the structure to form a germanium gradient in the channel region.

Referring to FIG. 11, a merge epitaxy region 104 of substantially pure germanium is grown selectively in the drain region of the structure 100 in some embodiments. Alternatively, germanium-containing material such as silicon germanium may comprise the epitaxial region 104. The germanium content of a silicon germanium epitaxial region may be in the range discussed above with respect to the first exemplary method. The germanium-containing epitaxial region 104 is formed on the exposed ends of the fins 22 beneath the dummy gate. As schematically illustrated, the region 104 extends laterally from the channel region as well as above and below the planes defined by the top and bottom surfaces of the channel region, similar to the silicon region 44 grown on the fins as shown in FIG. 6. The structure obtained following growth of the germanium region is thermally annealed, causing diffusion of germanium into the portions of the fins comprising the channel region. A germanium gradient 106 as shown in FIG. 12 is thereby formed within the silicon channel region. The germanium content increases in the direction of the drain region. The gradient is linear in some embodiments.

Figure 13:
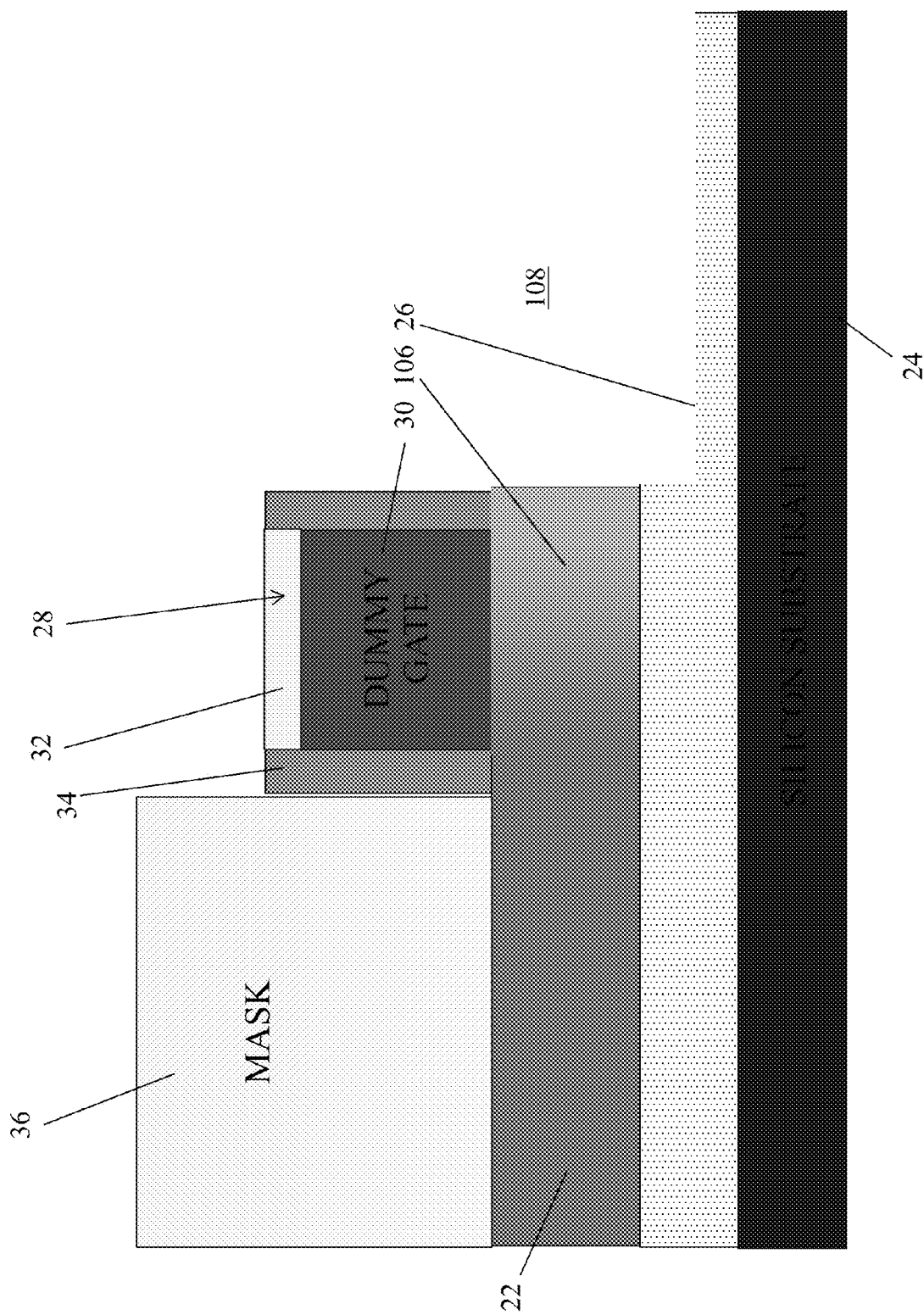
FIG. 13 is a schematic sectional illustration showing the structure of FIG. 12 following removal of the germanium layer from the drain region.

Referring to FIG. 13, an etching process is employed to remove the epitaxial germanium region 104. A recess 108 is accordingly formed that exposes the end of the channel region including the germanium gradient 106. The structure obtained is substantially the same as that described above with respect to FIG. 5. End portions of the fins comprising the channel region are exposed, thereby allowing the growth of a highly doped epitaxial silicon region within the recess 108 that functions as the operational drain region of the LBJT. The same steps described above with respect to FIGS. 6-9 are then performed to provide a finished lateral bipolar junction transistor such as shown in FIG. 9.

Given the discussion thus far and with reference to the exemplary embodiments discussed above and the drawings, it will be appreciated that, in general terms, an exemplary fabrication method includes obtaining a structure 20 comprising a plurality of parallel silicon fins 22 adjoining an electrically insulating layer 26 and a dummy gate 28 extending across a plurality of the silicon fins, the fins defining a channel region having a first conductivity type beneath the dummy gate, a source region on a first side of the dummy gate, and a drain region on a second side of the dummy gate.

The method further includes diffusing germanium into the channel region of the structure to form a germanium gradient 42 (106) within the channel region of increasing germanium content in the direction of the drain region. The drain region defined by the silicon fins 22 of the structure 20 is removed either prior to germanium diffusion, as shown in FIG. 10, or subsequent to germanium diffusion as shown in FIG. 5. The method further includes epitaxially growing a silicon region 44 on the second (drain) side of the dummy gate and from the fins 22 within the channel region subsequent to forming the germanium gradient 42 (106). The silicon region 44 is doped such that the silicon region has a second conductivity type opposite to the first conductivity type of the channel region. The dummy gate 28 is replaced by a functional gate structure that is operatively associated with the channel region 22B and electrical connections are formed to the gate structure and the silicon region 44. In some embodiments of the method, a germanium-containing layer 40 is grown on the drain region and the structure 20 is thermally annealed, thereby causing diffusion of germanium into the channel region as shown in FIG. 4. In one or more embodiments, the germanium is diffused substantially entirely or entirely across the channel region. In other embodiments of the method, a germanium-containing region is grown on the channel region subsequent to the step of removing the drain region as shown in FIG. 11. The structure is then thermally annealed, thereby causing diffusion of germanium into the channel region as shown in FIG. 12. As silicon germanium has a smaller bandgap than silicon, increasing the germanium content between the emitter and collector regions creates a conduction band gradient that accelerates the transport of electrons (collector current) and retards hole (base) current conduction, thereby boosting current gain in lateral bipolar junction transistors.

An exemplary lateral bipolar junction transistor is provided in accordance with one or more embodiments. The transistor includes a substrate including an electrically insulating layer 26. A doped silicon base region 22B adjoins the electrically insulating layer 26 and has a first conductivity type. A doped silicon emitter region 22A adjoins the electrically insulating layer and the base region 22B, the doped silicon emitter region having a second conductivity type. A doped silicon collector region 44 adjoins the electrically insulating layer and the base region, the doped silicon collector region having the second conductivity type. A germanium gradient is contained within the doped silicon base region. The germanium content increases in the direction of the collector region. A gate structure operatively associated with the doped silicon base region. In one or more embodiments of the transistor, the doped silicon base region includes a plurality of parallel fins.

Those skilled in the art will appreciate that the exemplary structures discussed above can be distributed in raw form or incorporated as parts of intermediate products or end products that benefit from having lateral bipolar junction transistors therein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation. It should also be noted that, in some alternative implementations, the steps of the exemplary methods may occur out of the order noted in the figures. For example, two steps shown in succession may, in fact, be executed substantially concurrently, or certain steps may sometimes be executed in the reverse order, depending upon the functionality involved.

The corresponding structures, materials, acts, and equivalents of all means or step plus function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

What is claimed is:

1. A method comprising:
    obtaining a structure comprising a plurality of parallel silicon fins adjoining an electrically insulating layer and a dummy gate extending across a plurality of the silicon fins, the fins defining a channel region having a first conductivity type beneath the dummy gate, a source region on a first side of the dummy gate, and a drain region on a second side of the dummy gate;
    diffusing germanium into the channel region of the structure to form a germanium gradient within the channel region having an increasing germanium content in the direction of the drain region;
    removing the drain region;
    removing a portion of the electrically insulating layer beneath the drain region;
    epitaxially growing a silicon region on the second side of the dummy gate and from the fins within the channel region subsequent to forming the germanium gradient;
    doping the silicon region such that the silicon region has a second conductivity type opposite to the first conductivity type;
    replacing the dummy gate with a gate structure operatively associated with the channel region; and
    forming electrical connections to the gate structure and the silicon region.

2. The method of claim 1, further including the steps of:
    growing a germanium-containing layer on the drain region; and
    thermally annealing the structure, thereby causing diffusion of germanium into the channel region.

3. The method of claim 2, further including the step of removing the germanium-containing layer prior to epitaxially growing the silicon region.

4. The method of claim 3, wherein the germanium-containing layer comprises silicon germanium.

5. The method of claim 3, wherein the step of diffusing germanium into the channel region further includes causing the germanium to be diffused substantially entirely or entirely across the channel region.

6. The method of claim 1, further including the steps of:
growing a germanium-containing region on the channel region subsequent to the step of removing the drain region; and
thermally annealing the structure, thereby causing diffusion of germanium into the channel region.

7. The method of claim 6, further including the step of removing the germanium-containing region prior to epitaxially growing the silicon region.

8. The method of claim 7, further including the step of forming a mask on the source region prior to the step of removing the drain region.

9. The method of claim 1, further including the step of doping the source region simultaneously with the step of doping the silicon region.

10. The method of claim 1, further including the step of epitaxially growing a highly doped silicon layer on the source region and the silicon region.

11. The method of claim 10, wherein the step of diffusing germanium into the channel region includes thermally annealing a germanium-containing layer in contact with one of the channel region and the drain region.

12. The method of claim 11, further including the steps of growing the germanium-containing layer on the drain region, removing the germanium-containing layer subsequent to thermally annealing the germanium-containing layer and, subsequent to removing the drain region, removing the portion of the electrically insulating layer beneath the drain region.

13. A method comprising:
obtaining a structure comprising a plurality of parallel silicon fins adjoining an electrically insulating layer and a dummy gate extending across a plurality of the silicon fins, the fins defining a channel region beneath the dummy gate, a source region on a first side of the dummy gate, and a drain region on a second side of the dummy gate;
diffusing germanium into the channel region of the structure to form a germanium gradient within the channel region having an increasing germanium content in the direction of the drain region;
removing the drain region;
removing a portion of the electrically insulating layer beneath the drain region;
epitaxially growing a semiconductor region on the second side of the dummy gate and from the fins within the channel region subsequent to forming the germanium gradient, removing the drain region and removing the portion of the electrically insulating layer beneath the drain region;
doping the channel region to obtain a first conductivity type within the channel region;
doping the semiconductor region such that the semiconductor region has a second conductivity type opposite to the first conductivity type;
replacing the dummy gate with a gate structure operatively associated with the channel region; and
forming electrical connections to the gate structure and the semiconductor region.

14. The method of claim 13, wherein doping the channel region further includes implanting the channel region with dopants prior to replacing the dummy gate with the gate structure.

* * * * *